United States Patent
Yang et al.

(10) Patent No.: US 7,215,550 B1
(45) Date of Patent: May 8, 2007

(54) HEAT SINK FASTENER

(75) Inventors: Bo-Yong Yang, Shenzhen (CN);
Yong-Dong Chen, Shenzhen (CN);
Guang Yu, Shenzhen (CN); Shih-Hsun Wung, Tucheng (TW); Chun-Chi Chen, Tucheng (TW)

(73) Assignee: Foxconn Technology Co., Ltd., Tu-Cheng (TW)

( * ) Notice: Subject to any disclaimer, the term of this patent is extended or adjusted under 35 U.S.C. 154(b) by 0 days.

(21) Appl. No.: 11/308,254

(22) Filed: Mar. 14, 2006

(51) Int. Cl.
*H05K 7/20* (2006.01)

(52) U.S. Cl. .............. 361/704; 361/687; 165/80.3; 165/121; 165/185; 24/459

(58) Field of Classification Search .......... 361/704, 361/687, 697, 715, 719, 707, 709–712; 165/80.3, 165/121, 185; 24/459, 296, 625, 455–458; 174/16.3
See application file for complete search history.

(56) References Cited

U.S. PATENT DOCUMENTS

| | | | | |
|---|---|---|---|---|
| 5,542,468 A | * | 8/1996 | Lin | 165/80.3 |
| 5,903,434 A | * | 5/1999 | Chiou | 361/704 |
| 5,979,025 A | * | 11/1999 | Horng | 24/459 |
| 5,999,402 A | * | 12/1999 | Jeffries et al. | 361/687 |
| 6,256,846 B1 | * | 7/2001 | Lee | 24/459 |
| 6,373,704 B1 | * | 4/2002 | Chen | 361/704 |
| 6,415,853 B1 | * | 7/2002 | Tao et al. | 165/80.3 |
| 2004/0190262 A1 | | 9/2004 | Lai | |
| 2005/0144764 A1 | | 7/2005 | Lin | |

* cited by examiner

*Primary Examiner*—Thao X. Le
*Assistant Examiner*—Courtney Smith
(74) *Attorney, Agent, or Firm*—Jeffrey T. Knapp

(57) ABSTRACT

A heat sink fastener includes a main body, a piercing body and an operating member. The main body includes a pressing part adapted for pressing a heat sink toward a heat-generating component, an engaging part and a latching leg, the engaging part and the latching leg being disposed at opposite ends of the pressing part. The piercing body includes a piercing part piercing through the engaging part and movable up and down in the engaging part, and a latching part below the piercing part and facing the latching leg. The operating member is connected to the piercing part and linearly movable along a direction perpendicular to the engaging part to put the pressing part in tension by exerting a force on the engaging part or to relax the tension by relieving the force exerted on the engaging part.

18 Claims, 5 Drawing Sheets

HEAT SINK FASTENER

FIELD OF THE INVENTION

The present invention relates generally to a heat sink fastener, and more particularly to a heat sink fastener for securing a heat sink to an electronic heat-generating component to remove heat from the heat-generating component.

DESCRIPTION OF RELATED ART

Heat sinks are usually used to remove heat from electronic heat-generating components, such as central processing units (CPUs) and the like, to keep the components at stable operation temperatures. A typical heat sink comprises a base for contacting a heat-generating component to absorb the heat on the heat-generating component and a plurality of fins extending from the base for dissipating the heat to ambient air.

To secure the heat sink to the heat-generating component, a fastener is required. A current fastener is disclosed in U.S. Patent Application Publication No. 2005/0144764A1. The fastener comprises a pressing member, an engaging member and a handle. The pressing member comprises an elongated elastic bent section with a bend end at an end thereof. The bent end defines an engaging hole therein for engaging with an engaging jut of a base which surrounds the heat-generating component. A slot is defined in an opposite end of the bent section. The engaging member at an end thereof has a joining part which is provided with a fitting hole for receiving another engaging jut of the base. The engaging member at an opposite end thereof has a piercing part which can pass through the slot. The handle at an end thereof is a pivotal end pivotally connected with the piercing part. A cam is provided on the pivotal end. The handle at an opposite end thereof has a pressing part to pivot the handle relative to the engaging member so that the cam is driven to move on the elastic bent section.

In use of the fastener to secure the heat sink to the base, the handle at the pressing part is pressed down to allow the handle pivoting with respect to the pivotal joint of the handle and the engaging member. The cam exerts a force on the elastic bent section such that the elastic bent section can generate tensile deformation against the heat sink to secure the heat sink to the heat-generating component firmly. However, pivoting of the handle about the pivotal joint needs a large amount of space. Pivoting of the handle by hand is done at the risk of damaging other electronic components around the heat-generating component. This renders the operation of the fastener difficult.

On the other hand, in order to prevent the handle from rotating back, an extension section having a hook at a distal end thereof is provided laterally from the opposite end of the handle. The hook fastens to a lateral side of the base to enhance the engaging effect of the fastener. However, detachment of the hook from the lateral side of the base can be inconvenient.

What is needed is a heat sink fastener which can easily and firmly attach the heat sink to the heat-generating component whilst still being easy to detach.

SUMMARY OF INVENTION

A heat sink fastener in accordance with a preferred embodiment of the present invention comprises a main body, a piercing body and an operating member. The main body comprises a pressing part adapted for holding a heat sink in contact with a heat-generating component, an engaging part and a latching leg, the engaging part and the latching leg being disposed at opposite ends of the pressing part. The piercing body comprises a piercing part piercing through the engaging part and movable up and down at the engaging part, and a latching part below the piercing part and facing the latching leg. The operating member is connected to the piercing part and linearly movable in a direction perpendicular to the engaging part to create tension in the pressing part by exerting a force on the engaging part or relaxation by releasing the force exerted on the engaging part.

Other advantages and novel features will become more apparent from the following detailed description of preferred embodiments when taken in conjunction with the accompanying drawings, in which:

DETAILED DESCRIPTION

Figure 1:
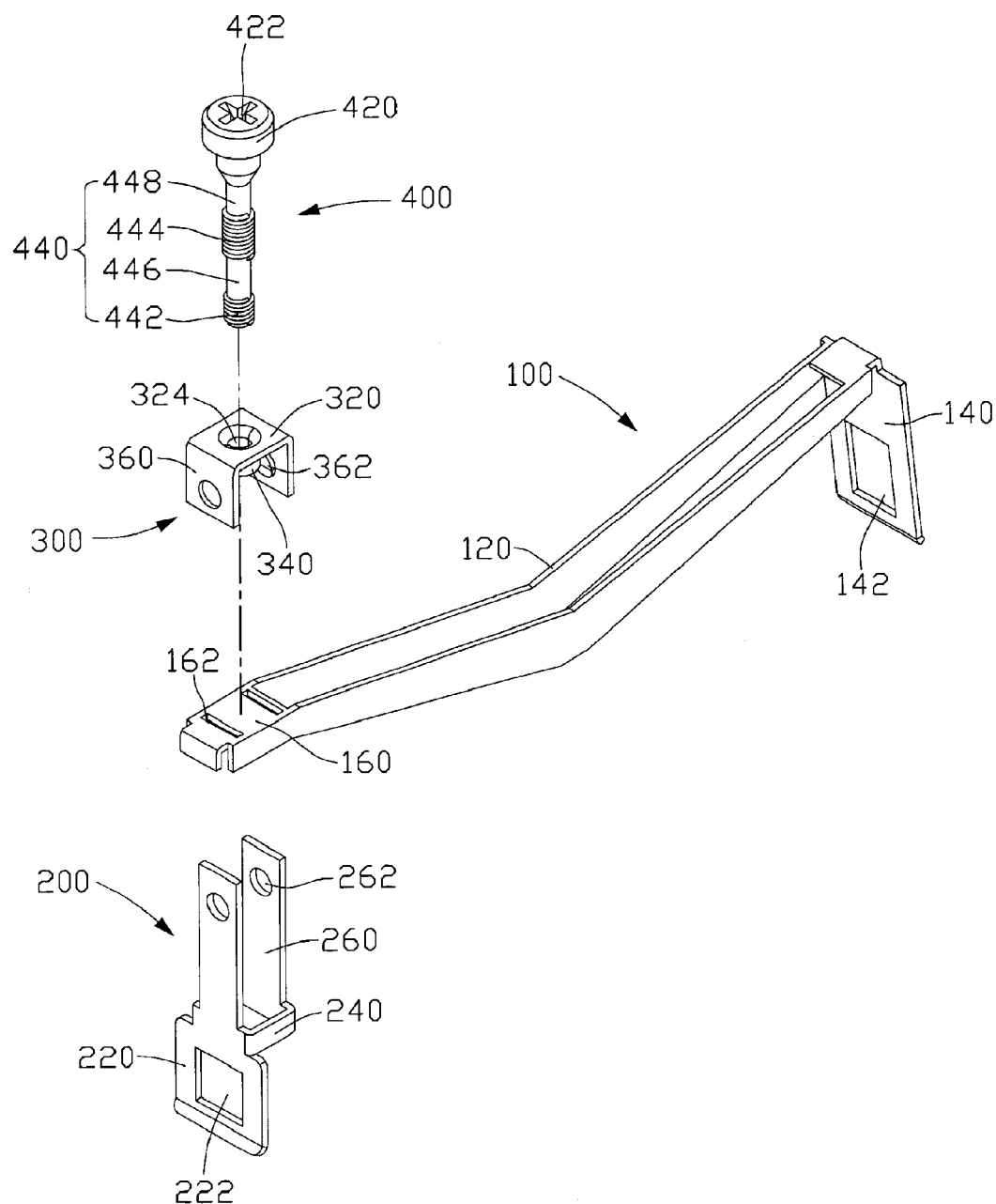
FIG. 1 is an exploded, isometric view of a heat sink fastener of a preferred embodiment in accordance with the present invention.
Figure 2:
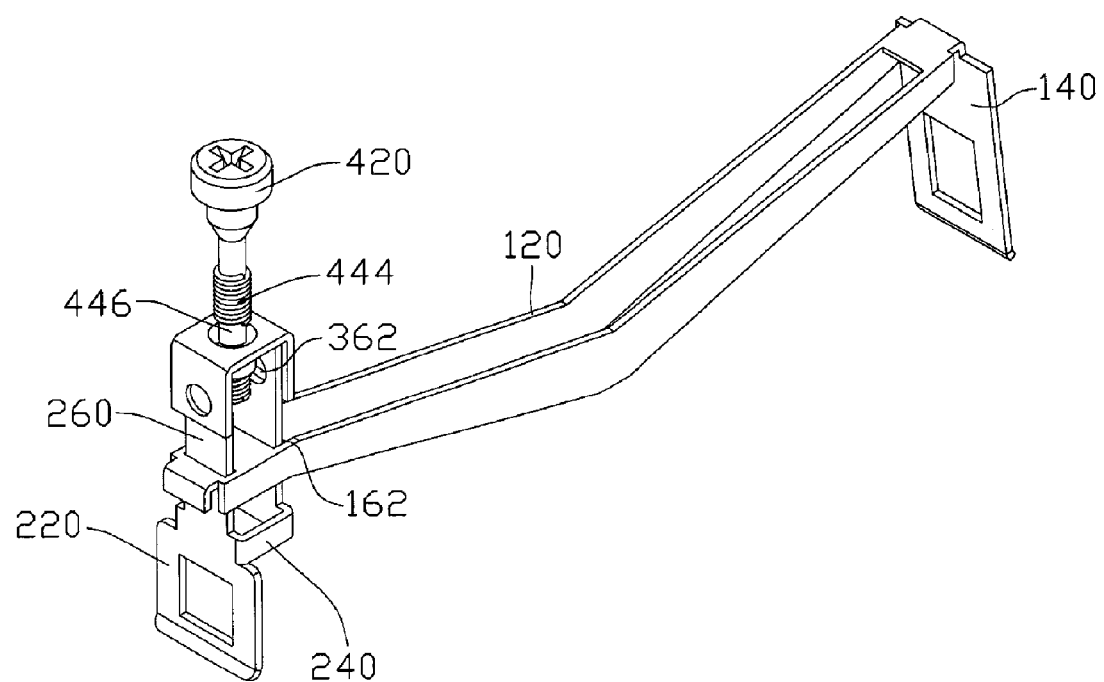
FIG. 2 is an assembled view of FIG. 1.

Referring to FIGS. 1–2, a heat sink fastener 10 in accordance with a preferred embodiment of the invention comprises a main body 100, a piercing body 200, a holder 300 and an operating member, such as a screw 400.

The main body 100 comprises an elongated pressing part 120, a latching leg 140 and an engaging part 160. The pressing part 120 is generally V-shaped for providing the pressing part 120 with resilience. The latching leg 140 extends downwardly and outwardly from a free end of the pressing part 120, and defines an opening 142 therein. The engaging part 160 extends horizontally from an opposite end of the pressing part 120, and defines two separate engaging grooves 162 therein. One groove 162 is adjacent to the pressing part 120 compared with the other.

The piercing body 200 comprises a vertical piercing part and a latching part 220. The piercing part comprises two piercing plates 260 which are separate from and parallel to each other and a bottom thereof connected by a connecting part 240. The latching part 220 is extended downwardly from the outer one of the piercing plates 260. Each piercing plate 260 can extend through a corresponding groove 162 of the engaging part 160 of the main body 100, and defines a bore 262 therein. The bores 262 are disposed above the engaging part 160 and the connecting part 240 is disposed below the engaging part 160, when the fastener 10 is assembled together. The latching part 220 faces the latching leg 140, when the piercing body 200 is engaged to the main body 100. The latching part 220 defines an opening 222 therein.

The holder 300 can be fabricated by stamping a metallic piece of stainless steel. The holder 300 comprises a horizontal support shoulder 320, a locking part and a hollow post 340. The locking part comprises two separate locking arms 360 extending downwardly and perpendicularly from opposite sides of the support shoulder 320. Each locking arm 360 forms an inner protrusion 362 stamped from an outside to an inside of the locking arm 360. The protrusions 362 can be received in the bores 262 of the piercing plates 260 to form an interconnecting member, making the holder 300 engage with the piercing body 200. The locking arms 360 abut outer surfaces of the piercing plates 260. The post 340 extends downwardly from a central portion of the support shoulder 320 and is disposed between the piercing plates 260. A through hole 324 is defined through the support shoulder 320 and the post 340, with inner thread (not shown) in the hollow post 340.

The screw 400 comprises a head 420 and a shaft 440 having a diameter smaller than that of the head 420. The head 420 at a top thereof defines a cross-shaped slot 422 therein for positioning a tool (not shown), such as a screwdriver. Separate first and second threads (not labeled) spiral on a circumference of the shaft 440 to divide the shaft 440 into first and second thread parts 442, 444, first and second non-thread parts 446, 448. The first thread part 442 is adjacent to a bottom free end of the shaft 440; the second thread part 444 is adjacent to the head 420 but separated from the head 420 by the second non-thread part 448. The first non-thread part 446 is interposed between the first and second thread parts 442, 444.

FIG. 2 shows the fastener 10 in an assembled state. The piercing plates 260 extend through the grooves 162 of the engaging part 160 respectively. The protrusions 362 of the holder 300 are received into the bores 262 of the piercing plates 260. Portions of the piercing plates 260 between a bottom extremity of the holder 300 and the connecting part 240 of the piercing plates 260 are movable up and down in the grooves 162 of the engaging part 160. The latching part 220 of the piercing plate 260 and the latching leg 140 face each other from opposite ends of the pressing part 120. The screw 400 is inserted into the through hole 322 of the holder 300 and the first thread part 442 extends through the through hole 324 of the holder 300 to render the first non-thread part 446 engaged with the through hole 324 of the holder 300.

Figure 3:
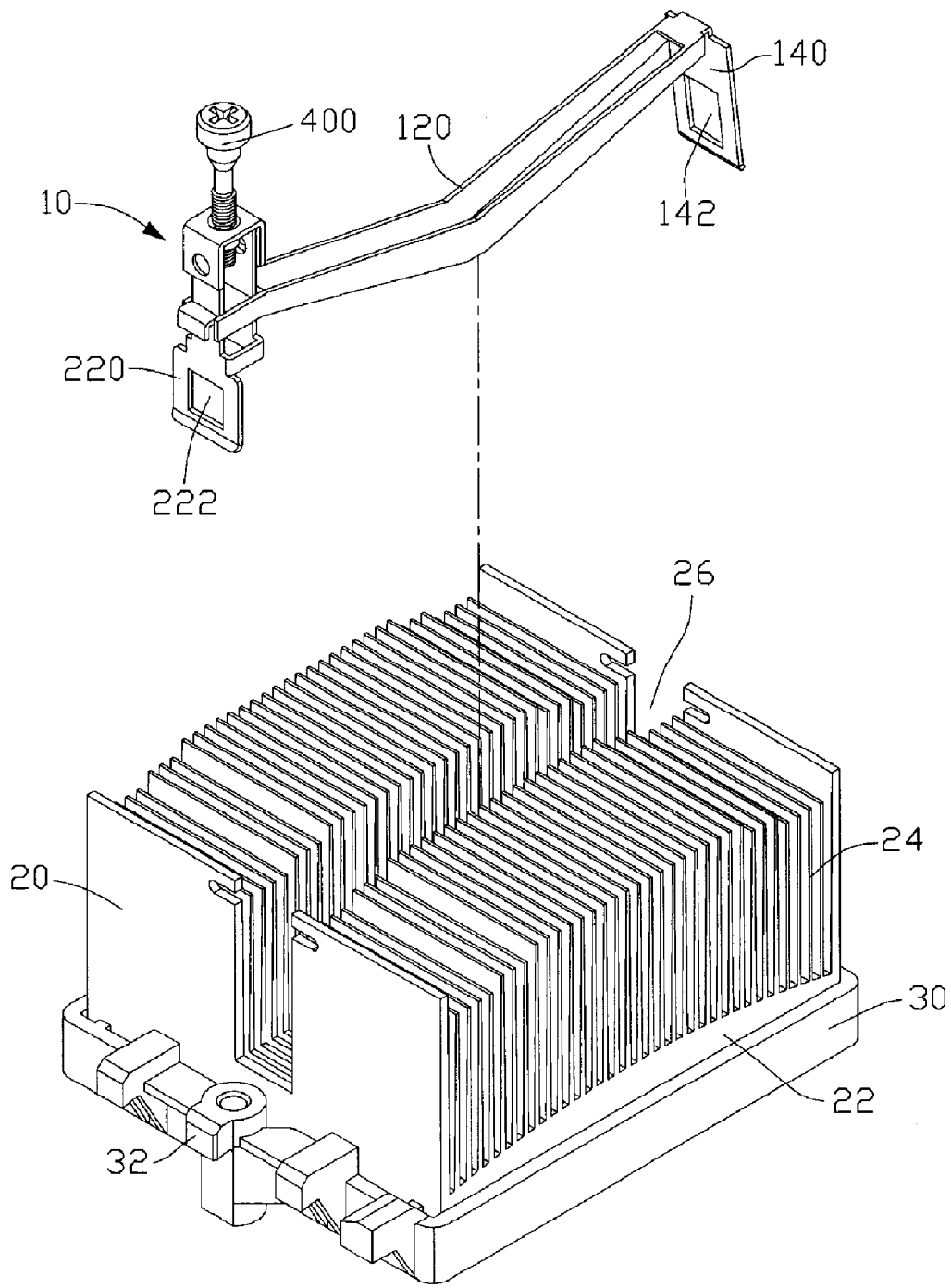
FIG. 3 is an isometric view of the heat sink fastener of FIG. 1, ready to secure a heat sink mounted on a base.
Figure 4:
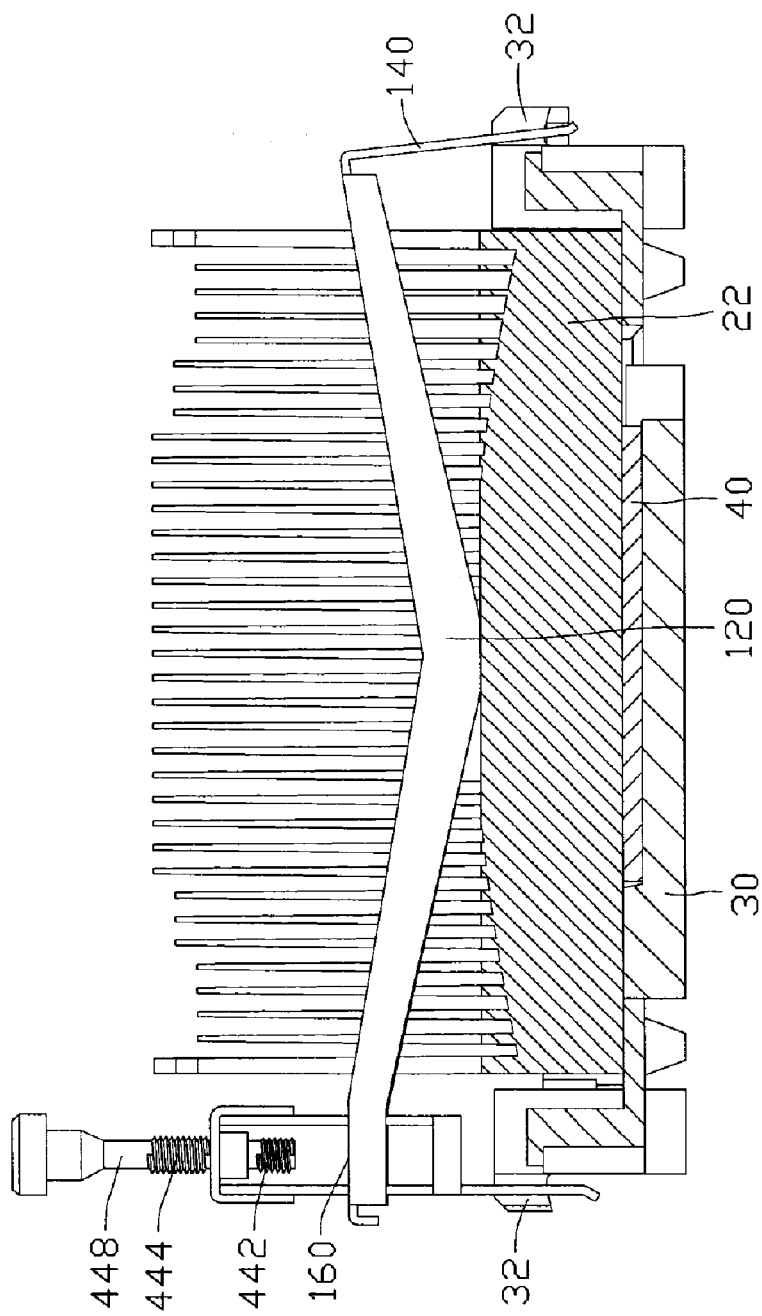
FIG. 4 is a cross-sectional view of the components of FIG. 3 assembled together, showing the fastener in an unlocked position ready to hold the heat sink in contact with the base.
Figure 5:
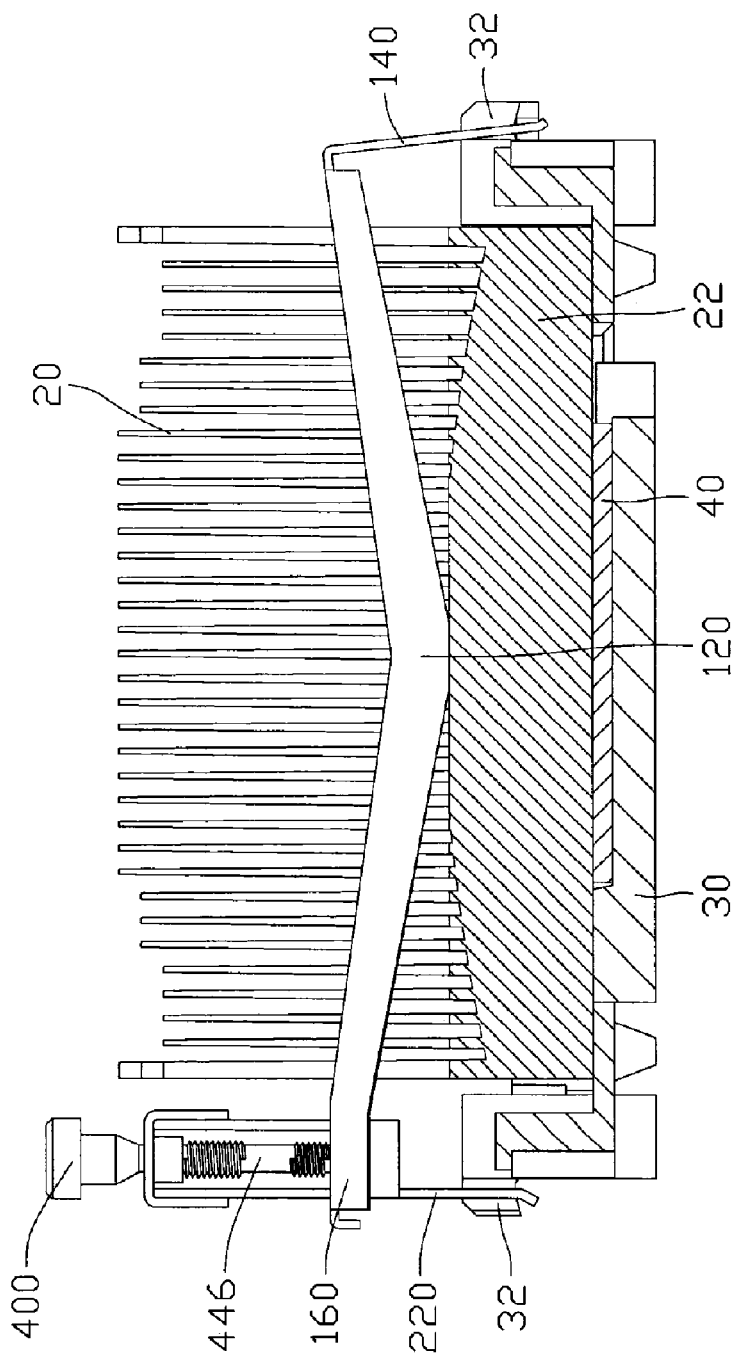
FIG. 5 is similar to FIG. 4, but showing the fastener in a locked position.

Referring to FIGS. 3–5, the fastener 10 can be used to secure a heat sink 20 which is supported and surrounded by a base 300. The base 300 is used to support a heat-generating component 40 thereon and comprises two catches 32 at opposite sides thereof, respectively. More specifically, the base 300 is a socket which can electrically connect the heat-generating component 40 such as a CPU to a printed circuit board (not shown) on which the base 300 is mounted. The heat sink 20 comprises a base 22 in contact with a top surface of the heat-generating component 40 and a plurality of fins 24 extending upwardly from the base 22. A channel 26 is defined through the fins 24 and spanning between the catches 32 of the base 30. With reference with FIG. 4, the pressing part 120 of the fastener 10 is positioned in the channel 26 of the heat sink 20. The openings 142, 222 of the latching leg 140 and the latching part 220 respectively loosely receive the catches 32 of the base 30. The fastener 10 is shown in an unlocked position in FIG. 4.

Particularly referring to FIG. 5, the screw 400 is operated to rotate in the through hole 324 and move toward the engaging part 160. After the first thread part 442 reaches the engaging part 160, further operation of the screw 400 rotating in the through hole 324 and moving toward the engaging part 160 can lift the combined piercing body 200 and holder 300. After the latching part 220 engages the corresponding catch 32 at a bottom extremity of the opening 222, the engaging part 160 of the main body 100 is depressed, by further operation of the screw 400 rotating in the through hole 324 and moving toward the engaging part 160. The pressing part 120 is thus deformed and the latching leg 140 is simultaneously lifted to engage the corresponding catch 32 of the base 30. Finally, the second thread part 444 of the screw 400 extends through the through hole 324 defined in the holder 300 to engage the second non-thread part 446 in the through hole 324 of the holder 300. The head 420 of the screw 400 is always above the support shoulder 320 of the holder 300. The latching part 220 and the latching leg 140 are tensely engaged with the catches 32 of the base 30. The pressing part 120 is thus caused to exert an urging force on the base 22 of the heat sink 20 toward the heat-generating component 40. At this time, the heat sink 20 is firmly mounted to the base 30 and intimately contacts the heat-generating component 40.

To detach the heat sink 20 from the base 30, the screw 400 is operated reversely to rotate in the through hole 324 and move away from the engaging part 160 to relax the pressing part 120. The latching leg 140 descends, having the opening 142 loosely receiving the corresponding catch 32 of the base 30. Then, the latching part 220 descends, having the opening 222 loosely receiving the corresponding catch 32 of the base 30. At this time, the fastener 10 can be removed, and the heat sink 20 can thus be detached from the base 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink fastener comprising:
    a main body comprising an elongated pressing part adapted for holding a heat sink in contact with a heat-generating component, an engaging part and a latching leg respectively at opposite ends of the pressing part;
    a piercing body comprising a piercing part extending through the engaging part of the main body and a latching part extending downwardly from the piercing part and facing the latching leg of the main body;
    a holder comprising a support shoulder, two locking arms extending from the support shoulder and sandwiching the piercing part of the piercing body therebetween, and a post extending from the support shoulder, a through hole extending through the support shoulder and the post; and
    a screw comprising a head above the support shoulder and a shaft having alternately arranged thread parts and non-thread parts, the shaft being rotatable in the through hole, and the thread parts and the non-thread parts selectively engagable within the through hole to adjust a location relationship between the screw and the engaging part.

2. The heat sink fastener as claimed in claim 1, wherein the engaging part defines two separate grooves therein for the piercing part extending therethrough, one of the grooves being adjacent to the pressing part.

3. The heat sink fastener as claimed in claim 2, wherein the piercing part is movable up and down in the grooves of the engaging part.

4. The heat sink fastener as claimed in claim 1, wherein the piercing part comprises two piercing plates parallel to each other and engaged with the locking arms.

5. The heat sink fastener as claimed in claim 4, wherein the piercing plates at bottom thereof are connected by a connecting part.

6. The heat sink fastener as claimed in claim 4, wherein interconnecting members are formed between the piercing plates and the locking arms to have the holder and the piercing part interconnected together.

7. The heat sink fastener as claimed in claim 6, wherein the interconnecting members comprise protrusions formed on the locking arms and bores defined in the piercing plates to receive the protrusions.

8. The heat sink fastener as claimed in claim 1, wherein the post extends perpendicularly from a central portion of the support shoulder.

9. The heat sink fastener as claimed in claim 1, wherein the head at a top thereof defines a cross-shaped slot therein.

10. A fastener comprising:
  a main body comprising a pressing part adapted for holding a heat sink in contact with a heat-generating component, an engaging part and a latching leg, the engaging part and the latching leg being disposed at opposite ends of the pressing part;
  a piercing body comprising a piercing part piercing through the engaging part and movable up and down through the engaging part, and a latching part below the piercing part and facing the latching leg; wherein a holder is connected to the piercing part and
  an operating member connected to the piercing part and linearly movable in a direction perpendicular to the engaging part to put the pressing part under tension by exerting a force on the engaging part and to relax the tension by relieving the force exerted on the engaging part.

11. The fastener as claimed in claim 10, wherein the holder defines a through hole therein, and wherein the operating member is rotatable in the through hole.

12. The fastener as claimed in claim 11, wherein the holder comprises a shoulder and a post extending perpendicularly from the shoulder, and wherein the through hole is defined through the shoulder and the post.

13. The fastener as claimed in claim 12, wherein the operating member comprises a head above the shoulder and a shaft which comprises alternately arranged thread parts and non-thread parts, and wherein the thread parts and the non-thread parts are selectively engaged in the through hole.

14. The fastener as claimed in claim 12, wherein the holder further comprises two locking arms extending perpendicularly from the shoulder and engaging with the piercing part.

15. An electronic assembly comprising:
  a base having two catches at opposite sides thereof, respectively;
  a heat-generating electronic component mounted on the base;
  a heat sink mounted on the heat-generating electronic component; and
  a fastener having a main body having a middle pressing part urging the heat sink toward the heat-generating electronic component and a latching leg engaging with one of the catches, a piercing body having a latching part engaging with the other one of the catches and at least a piercing plate extending upwardly through an end of the main body, a holder secured with a part of the at least a piercing body above the end of the main body, and a operating member engaging with the holder and exerting a downward force on the end of the main body and an upward force on the holder and the piercing body;
  wherein the operating member has separated lower and upper threaded portions between the end of the main body and the holder.

16. The electronic assembly as claimed in claim 15, herein the operating member is movable relative to the holder, and when the operating member is moved to a position in which the upper threaded portion is located above the holder, the latching leg and the latching part disengage from the catches.

17. The electronic assembly as claimed in claim 16, wherein the operating member is movable relative to the holder by rotating the operating member.

18. The electronic assembly as claimed in claim 17, wherein the holder has a support shoulder through which the operating member extends, and a pair of locking arms extending downwards from opposite sides of the support shoulder, the piercing body having two piercing plates extending upwardly through the end of the main body, the pair of locking arms secured with the parts of the two piercing plates above the end of the main body, respectively.

* * * * *

UNITED STATES PATENT AND TRADEMARK OFFICE
CERTIFICATE OF CORRECTION

PATENT NO.         : 7,215,550 B1                                             Page 1 of 1
APPLICATION NO. : 11/308254
DATED              : May 8, 2007
INVENTOR(S)        : Bo-Yong Yang It is certified that error appears in the above-identified patent and that said Letters Patent is hereby corrected as shown below:

Please replace the assignee on the Title Page (73) of the Patent Issuing on the Above-Identified Application with the following: -- Fu Zhun Precision Industry (Shenzhen) Co., LTD., Shenzhen, China; Foxconn Technology Co., LTD, Tu-Cheng, Taiwan --

Signed and Sealed this

Eleventh Day of September, 2007

JON W. DUDAS
*Director of the United States Patent and Trademark Office*